United States Patent [19]

Kaneko et al.

[11] Patent Number: 4,473,803

[45] Date of Patent: Sep. 25, 1984

[54] ELECTRONIC VOLUME CONTROL CIRCUIT FOR AUDIO DEVICES

[75] Inventors: Akio Kaneko; Hitoshi Kajiwara; Kazuya Nishiga; Yukihiko Haikawa, all of Iwaki, Japan

[73] Assignee: Alps Electric Co., Ltd., Japan

[21] Appl. No.: 438,939

[22] Filed: Nov. 3, 1982

[30] Foreign Application Priority Data

Nov. 5, 1981 [JP] Japan ................................ 56-177635

[51] Int. Cl.[3] ................................................ H03G 3/02

[52] U.S. Cl. .................................... 330/144; 330/279; 330/284

[58] Field of Search ............... 330/127, 129, 137, 144, 330/145, 278, 279, 284; 307/540, 541; 333/81 R; 381/104, 109; 455/249

[56] References Cited

U.S. PATENT DOCUMENTS

| | | | |
|---|---|---|---|
| 3,961,281 | 6/1976 | Woolling | 330/129 |
| 4,238,724 | 12/1980 | Klaus et al. | 323/80 |
| 4,280,089 | 7/1981 | van de Plassche et al. | 323/354 |
| 4,290,065 | 9/1981 | Gleason | 340/870 |
| 4,300,108 | 11/1981 | Shuck et al. | 333/81 |

*Primary Examiner*—James B. Mullins
*Attorney, Agent, or Firm*—Guy W. Shoup; Gerard F. Dunne

[57] ABSTRACT

An electronic volume for effecting a control of an impedance circuit in audio devices or the like includes a variable impedance circuit disposed in a signal transmission path and adapted to vary the impedance in accordance with an electronic control signal. A hold/-through gate switchable between a hold state and a through state and adapted to permit, when taking the through state, the input signal to pass therethrough in synchronization with a clock signal of a predetermined period and, when taking the hold state, to hold and deliver the input signal as a control signal to the variable impedance circuit, is connected to a control circuit adapted to vary the input signal supplied to the hold/-through gate at a predetermined rate at each time of receipt of the hold/through gate, and a rate changing means is provided for changing the rate of variation of the input signal coming through the hold/through gate.

6 Claims, 5 Drawing Figures

ELECTRONIC VOLUME CONTROL CIRCUIT FOR AUDIO DEVICES

BACKGROUND OF THE INVENTION

The present invention relates to an electronic volume and more particularly, to an electronic volume which is improved to permit an easy change of rate of impedance variation in a variable impedance circuit.

Generally, an audio circuit incorporates various variable impedance circuits such as a bass control circuit, treble control circuit, balance control circuit and volume control circuit. Such a variable impedance circuits are usually composed of a variable resistor directly connected to the signal transmission path. In some cases, however, the variable impedance circuit is composed of a so-called electronic volume in which a variable resistor is connected out of the signal transmission path and an impedance circuit such as transistor connected to the signal transmission path is controlled by an electronic control signal.

FIG. 1 schematically shows the circuit arrangement of an example of known electronic volumes. In this figure, a reference numeral 1 denotes a variable impedance circuit for use in various controls of audio signals, e.g. a bass control, treble control, balance control and volume control. This variable impedance circuit is adapted to have its impedance varied by means of a control circuit 2 having two keys: namely, an up key 2*u* and a down key 2*d*. In the illustrated example, the control circuit 2 has a logical circuit 2*b* and an adder (adder/subtractor) 2*a* in addition to these keys 2*u* and 2*d*. A reference numeral 3 designates a hold/through gate the state of which is switchable by means of a change-over switch 3*a* between a hold state and a through state. In the through state, the hold/through gate 3 permits the signal from the adder 2*a* to pass therethrough in accordance with a clock signal, whereas, in the hold/-through state, the hold gate 3 holds, as the control signal for the variable impedance circuit 1, the last input signal which has passed therethrough when the same is in the through state.

The signal which has passed the hold/through gate 3 is fed back to the adder 2*a* as an input to the A terminal of the latter. In the illustrated example, therefore, the adder 2*a*, i.e. the control circuit 2 adds or substracts 1 (one) in synchronization with the clock signal of the hold/through gate 3.

Assume here that the change-over switch 3*a* of the hold/through gate 3 has been switched to place the gate 3 into its through state and that a key, for example the up key 2*u*, is actuated. In consequence, the input to the B terminal of the adder 2*a* takes the logically "0" level while the input of the carry terminal of the adder 2*a* takes the logically "1" level, by the operation of the logic circuit 2*b* consisting of three elements. Consequently, 1 is added to the data (a) which has been stored in the adder 2*a*. Then, the new data (a)+1 obtained as a result of the addition is temporarily stored in the gate 3 and is then applied to a D-A converter 4 and the adder 2*a*.

The clock signal is delivered to the gate 3 at a predetermined period. If the up key 2*u* is pressed continuously, the data applied to the adder 2*a* and the D-A converter 4 are increased at each time a clock signal is received, and the impedance of the variable impedance circuit 1 is increased corresponding to the increase of the data. Thus, adjustment of the impedance is completed by stopping actuation of the up key 2*u* when the impedance of the variable impedance circuit 1 has reached the desired value while observing the display on the display device 6 which receives a signal from the logic circuit 2*b* through a pattern converter 5. To the contrary, the B terminal input and the carrier terminal input to the adder 2*a* take the "1" level and "0" level, respectively, as the down key 2*d* is actuated. The subtraction of the data is made in this case by the same principle as that for the addition. After the completion of the adjustment, of the impedance change-over switch 3 is closed to keep the gate 3 in the hold state, so that any undesirable change of impedance in the impedance circuit 1 attributable to an accidental actuation touch of the key 2*u* or 2*d* is avoided advantageously.

In the electronic volume 7 having the described construction, since the period of the clock signal applied to the gate 3 is fixed, an impractically long time may be required when the impedance has to be varied largely or, to the contrary, the aimed impedance variance is exceeded even by a short manipulation of the keys 2*u* or 2*d* when a delicate variation of the impedance is required.

SUMMARY OF THE INVENTION

Accordingly, it is a primary object of the invention to overcome the above-described problems of the prior art by providing an improved electronic volume which is improved to permit an easy change of the rate of variation of the impedance in such a manner that, when it is desired to vary the impedance largely, the rate of variation is increased to complete the adjustment in a shorter time, whereas, when a fine adjustment of the impedance is required, the rate of variation of impedance is decreased to afford a delicate and exact adjustment of the impedance.

These and other objects, features and advantages of the invention will become clear from the following description of the preferred embodiment taken in conjunction with the accompanying drawings.

DESCRIPTION OF THE PREFERRED EMBODIMENT

Figure 1:
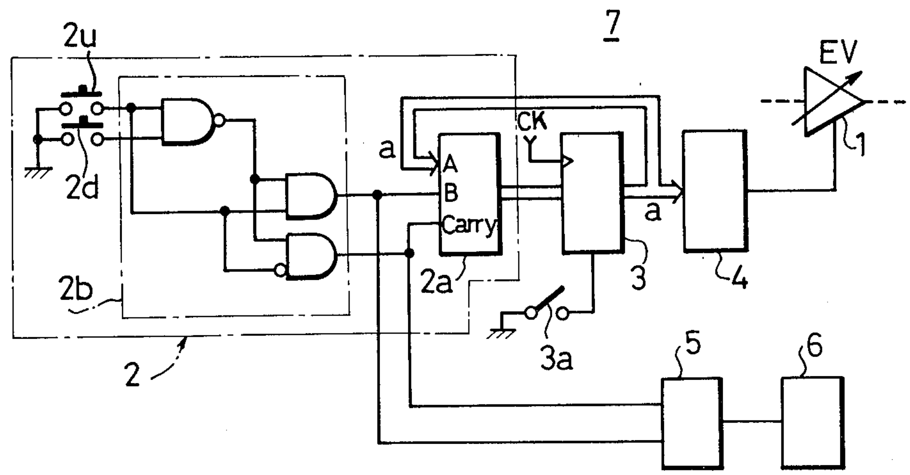
FIG. 1 schematically shows the circuit of an example of a conventional electronic volume.
Figure 2:
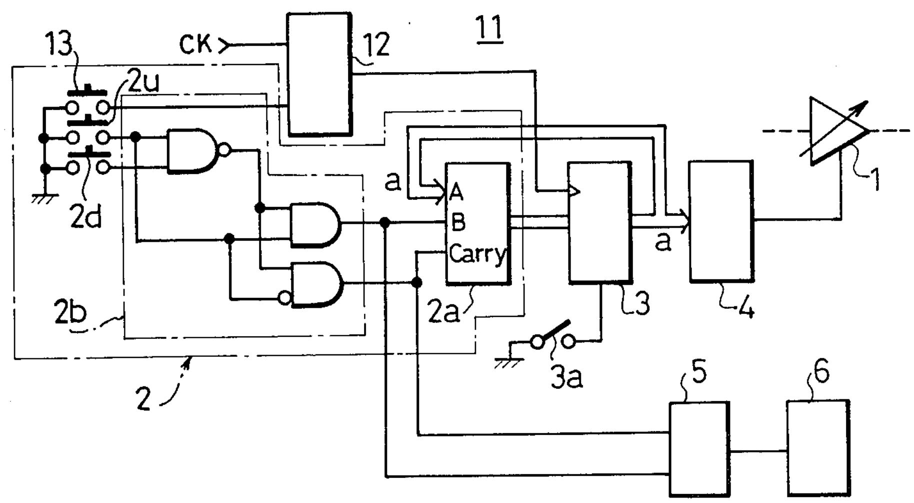
FIG. 2 schematically shows the circuit of an electronic volume in accordance with an embodiment of the invention.
Figure 3:
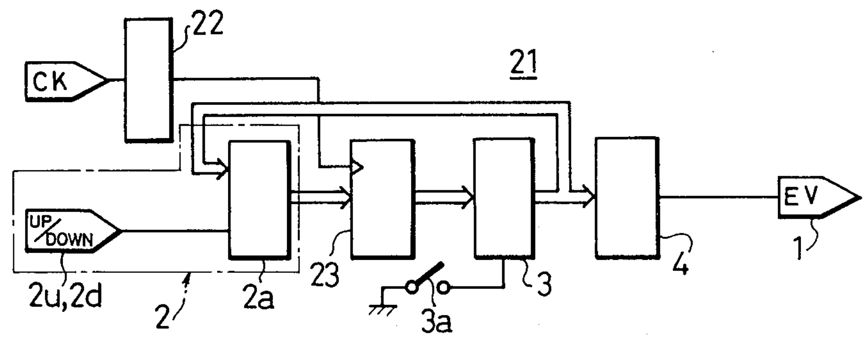
FIGS. 3 to 5 schematically show essential parts of different modifications of the electronic volume shown in FIG. 2.

A preferred embodiment of the invention will be described hereinunder with reference to FIGS. 2 through 5. FIG. 2 schematically shows an electronic volume 11 constructed in accordance with an embodiment of the invention. In this Figure, the same reference numerals are used to denote the same parts or members as those in FIG. 1. Referring to FIG. 2, an electronic volume 11 is constructed to permit a division of the clock signal applied to the gate 3 by means of a frequency divider 12. Namely, the frequency divier 12 has a fast key 13 connected to the control input terminal thereof. The control input takes the "L" or logically low level when this fast key 13 is pressed to complete the circuit so that the frequency dividing operation of the frequency divider 12 is stopped. In consequence, the clock signal is directly sent to the gate 3. On the other hand, when the fast key 13 is kept opened, the control input of the frequency divider 12 takes "H" or the logically high level to place the frequency divider 12 in operation to divide the frequency of the clock signal so that a clock signal of a longer period is delivered to the gate 3.

In the illustrated embodiment, therefore, it is possible to vary the speed of addition or subtraction effected on the gate 3, by the manipulation of the fast key 13. When it is desired to vary the impedance of the variable impedance circuit 1 at a large rate, the rate of addition or subtraction is increased by a depression of the fast key 13 so that the adjustment is completed in a short period of time. To the contrary, for effecting a fine adjustment of the impedance of the variable impedance circuit 1, the impedance is adjusted delicately by the addition or subtraction which is conducted at a small rate of manipulation of an up key **2*u* or down key 2*d*, without using the fast key 13**.

Figure 4:
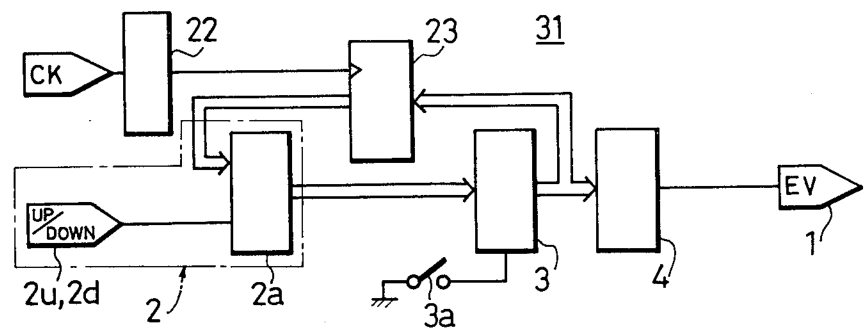

In the illustrated embodiment, the period of the clock signal supplied to the gate 3 is changed by means of the frequency divider 12. This, however, is not exclusive and the arrangement may be such that a clock signal from another gate 23 provided in the signal line leading from the adder **2*a* to the gate 3 is varied by a frequency divider 22, as in the case of the electronic volume 2' shown in FIG. 3. FIG. 4 shows an electronic volume 31 of another modification in which the gate 23 is not provided in the signal line leading from the adder 2*a* to the gate 3 but in the signal line leading from the gate 3 back to the adder 2*a*. In this case, the adder 2*a* operates at a speed lower than that of the gate 3**.

Figure 5:
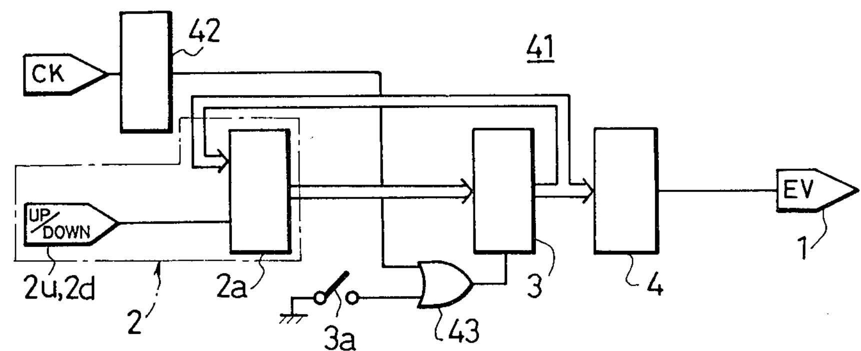

In the embodiments described above, the period of the clock signal supplied to the clock input terminal of the gate 3 is varied. This, however, can be modified as shown in FIG. 5. Namely, FIG. 5 shows an electronic volume of still another modification in which an OR gate 43 is provided between the gate 3 and the associated change-over switch **3*a*, and the clock signal divided by the frequency divider 42 is used as a gate signal of the OR gate 43**.

Although in the illustrated embodiment the speed of addition or subtraction is varied by varying the period of the clock signal for controlling the operation of the gate 3, the invention does not exclude such a modification that the speed of addition or subtraction is varied by varying the coefficients of the addition and subtraction.

It is also possible to unite the up key **2*u* and the down key 2*d* in one key unit, although these keys are provided separately in the embodiment and modifications described hereinbefore. It is also possible to use two fast keys 13, one for the up key 2*u* and the other for the down key 2*d***.

It is possible to use, in place of the digital control circuit 2 adapted to change the input signal digitally, an analog control circuit in each of the described embodiment and modifications.

When a plurality of variable impedance circuits 1 are arranged in parallel, the arrangement may be such that only one control circuit 2 is provided commonly for all impedance circuits and only the desired variable impedance circuit 1 is connected to the control circuit by means of a suitable switch means.

As has been described, according to the invention, there is provided an electronic volume having a hold/through circuit having a hold/through gate which is switchable between its hold state or its through state. The hold/through gate 3 permits, when taking the through state, an input signal to be passed therethrough in synchronization with a clock signal and, when taking the hold state, to hold the input signal as a control signal and to deliver the same to a variable impedance circuit. The input signal delivered to the hold/through gate is varied at a predetermined rate by a control circuit while the rate of variation of the input signal coming through the hold/through gate is changed by a varying rate changing means. According to the invention, therefore, it is possible to easily change the rate of variation of the impedance in a variable impedance circuit. When it is desired to vary the impedance largely, the rate of variation of the input signal is increased to make it possible to complete the impedance adjustment in a shorter time, whereas, when a fine adjustment of impedance is required, the rate of variation of the input signal is decreased to permit a delicate adjustment of the impedance.

The electronic volume of the invention incorporates, as means for changing the rate of variation of the input signal coming through the hold/through gate, a frequency divider for demultiplying the clock signal of the hold/through gate or a frequency divider which demultiplies the signal coming through the hold/through gate and delivers the same to the control circuit. According to this arrangement, the control circuit can change the rate of variation of the input signal without requiring an assist from any specific circuit. The means for changing the rate of variation of impedance may be constituted by a switching means which intermittently switches the hold/through gate to the hold state. In such a case, it is possible to make an efficient use of a change-over switch which is provided for selectively changing the state of the hold/through gate either to the hold state or through state.

What is claimed is:

1. An electronic volume for adjusting the level of a signal in a signal transmission path comprising:

(a) a variable impedance circuit adapted to be disposed in the signal transmission path and adapted to vary the impedance by an electronic control signal;

(b) means including a hold/through gate switchable between a hold state and a through state and adapted to permit, when taking the through state, an input signal to pass therethrough in synchronization with a clock signal of a predetermined period and, when taking the hold state, to hold the input signal coming therethrough as a control signal and to deliver the same to said variable impedance circuit;

(c) means including a control circuit for varying the input signal delivered to said hold/through gate at a predetermined rate at each time of receipt of the signal coming through said hold/through gate; and (d) a rate changing means for changing the rate of variation of the input signal coming through said hold/throuh gate.

2. An electronic vlume according to claim 1, wherein said rate changing means includes a frequency divider for dividing the clock signal of said hold/through gate.

3. An electronic volume according to claim 1, wherein said rate changing means includes a frequency divider adapted to divide the signal coming through said frequency divider and to deliver the divided signal to said control circuit.

4. An electronic volume according to claim 1, wherein said rate changing means includes a switching means which intermittently switches the state of said hold/through gate to said hold state.

5. An electronic volume according to claim 1, wherein said rate changing means includes a gate for relaying the signal supplied to said hold/through gate and a frequency divider for effecting a division of clock signal of a said gate.

6. An electronic volume according to claim 1, wherein said rate changing means includes an OR gate disposed between said hold/through gate and a change-over switch for switching the state of said hold/through gate, and a frequency divider for dividing the clock signal as the gate signal for said OR circuit.

* * * * *